United States Patent
Churcher et al.

(10) Patent No.: US 6,239,616 B1
(45) Date of Patent: *May 29, 2001

(54) PROGRAMMABLE DELAY ELEMENT

(75) Inventors: Stephen Churcher; Simon A. Longstaff, both of Edinburgh (GB)

(73) Assignee: Xilinx, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/559,250

(22) Filed: Apr. 26, 2000

Related U.S. Application Data (62) Division of application No. 09/454,179, filed on Dec. 2, 1999, now Pat. No. 6,133,751, which is a division of application No. 09/129,306, filed on Aug. 5, 1998, now Pat. No. 6,034,548, which is a division of application No. 08/786,819, filed on Jan. 21, 1997, now Pat. No. 5,841,296.

(51) Int. Cl.$^7$ ................................................ H03K 19/173
(52) U.S. Cl. ............................................ 326/49; 328/27
(58) Field of Search ................................ 326/26, 27, 49, 326/83, 86, 30

(56) References Cited

U.S. PATENT DOCUMENTS

| | | | |
|---|---|---|---|
| 4,758,985 | 7/1988 | Carter | 326/40 |
| 4,877,978 | 10/1989 | Platt | 326/86 |
| 4,894,791 | 1/1990 | Jiang et al. | 327/393 |
| 4,959,564 | 9/1990 | Steele | 326/44 |
| 5,012,143 | 4/1991 | Boudewijns | 327/281 |
| 5,051,625 | 9/1991 | Ikeda et al. | 326/26 |

(List continued on next page.)

FOREIGN PATENT DOCUMENTS

| | | | |
|---|---|---|---|
| 1-320 816 | 12/1989 | (JP) . | |
| 2-196 510 | 8/1990 | (JP) | 327/290 |
| 4-267 613 | 6/1992 | (JP) | 327/281 |

OTHER PUBLICATIONS

H.B. Bakoglu, "Circuits, Interconnections, and Packaging for VLSI," Chapter 8, Section 6, pp. 358–360, Addison–Wesley, 1990 (ISBN 0–201–06008–6).

T. Gabara et al., "Forming Damped LRC Parasitic Circuits in Simultaneously Switched CMOS Output Buffers," IEEE Custom Integrated Circuits Conference, pp 277–280, May, 1996.

Primary Examiner—Michael Tokar
Assistant Examiner—Don Phu Le
(74) Attorney, Agent, or Firm—Bever, Hoffman & Harms, LLP; Jeanette S. Harms; Lois D. Cartier (57) ABSTRACT

The invention provides a programmable delay element and a programmable slew rate element to allow post-fabrication adjustment and programming of input delay and output slew rate to iteratively alter input delay and output slew rate without redesign and refabrication of the circuit. The invention provides programmable memory cells coupled to a capacitive load via a plurality of switches. The capacitive load is coupled to a signal path and comprises a plurality of capacitors. The programmable memory cells selectively turn on the switches coupled to the capacitive load. In one FPGA implementation, the programmable memory cells are implemented in IOBs and are loaded with appropriate data during a device configuration stage. Delay equalization can be achieved by programming the memory cells such that the delays seen by device I/O pins are equal between IOBs and pads. The invention also provides a slew rate control circuit for an inverter or a buffer to provide an optimal slew rate. The slew rate control circuit comprises a plurality of memory cells coupled to a current mirror via a plurality of switches. Appropriate data are programmed or loaded into the memory cells to selectively turn the switches coupled to a current source on or off. The current mirror is also coupled to the inverter or buffer to control its supply current. The slew rate of the inverter or buffer is controlled via the memory cell programming.

24 Claims, 8 Drawing Sheets

U.S. PATENT DOCUMENTS

| | | | |
|---|---|---|---|
| 5,160,863 | 11/1992 | Hui | 327/277 |
| 5,287,025 | 2/1994 | Nishimichi | 327/281 |
| 5,384,497 | 1/1995 | Britton et al. | 326/44 |
| 5,459,422 | 10/1995 | Behrin | 327/281 |
| 5,644,496 | 7/1997 | Agrawal et al. | 326/41 |
| 5,650,739 | 7/1997 | Hui et al. | 327/262 |
| 5,705,942 | 1/1998 | Ashuri | 326/93 |
| 5,917,758 | 6/1999 | Keeth | 326/26 |

PROGRAMMABLE DELAY ELEMENT

RELATED APPLICATIONS

This application is a divisional of U.S. patent application Ser. No. 09/454,179 entitled "Programmable Delay Element" filed on Dec. 2, 1999, now U.S. Pat. No. 6,133,751 which is a divisional of U.S. Ser. No. 09/129,306, now U.S. Pat. No. 6,034,548 filed on Aug. 5, 1998 which issued on Mar. 7, 2000, which is a divisional of U.S. Ser. No. 08/786,819, now U.S. Pat. No. 5,841,296 filed Jan. 21, 1997 which issued on Nov. 24, 1998. All are incorporated herein by reference.

BACKGROUND OF THE INVENTION

1. Field of the Invention

This invention relates to the design of electronic circuits and in particular, to the design of programmable delay elements.

2. Background Art

A Field-Programmable Gate Array (FPGA) is a digital integrated circuit capable of being programmed to provide a variety of different logic functions. An FPGA is unique in that it allows reprogramming or configuration to define its functionality by using on-chip fuses, EPROM (UV erasable programmable read-only memory) circuits, EEPROM (electrically erasable programmable read-only memory) circuits, and RAM (random access memory) circuits which programmably create data paths and logic functions within the device that are specific to the user's design.

State of the art FPGAs make use of one or more non-volatile memory cell arrays (e.g. EPROM, EEPROM, Flash EPROM, or Flash EEPROM) so that they can retain their configuration memory during power-down. Typically, these arrays are erasable, thereby allowing the desired functionality of the FPGA to be reprogrammed many times.

Figure 1:
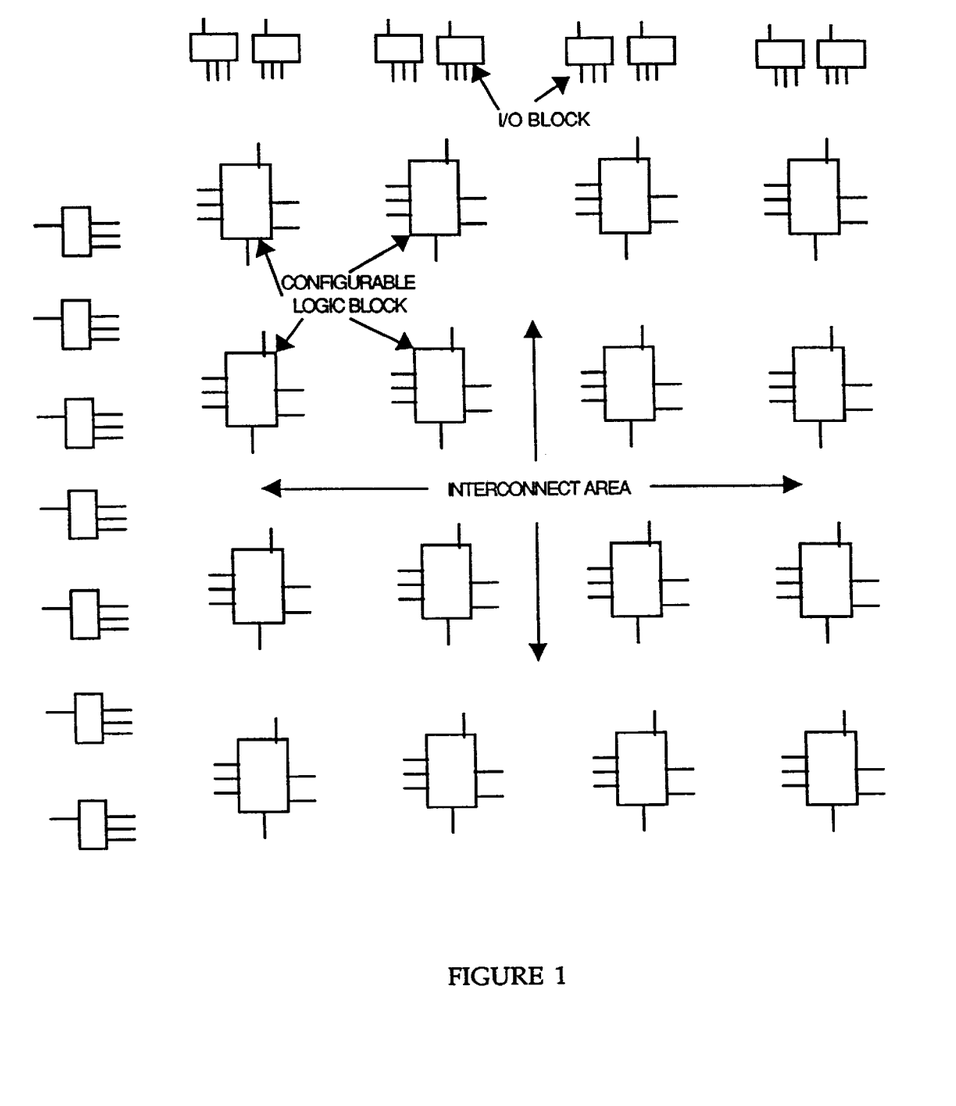
FIG. 1 is a block diagram of a prior art FPGA architecture.

FIG. 1 is a block diagram of an FPGA architecture which includes Configurable Logic Blocks (CLBs), Input/Output Blocks (IOBs), and a programmable interconnect network. CLBs are configurable circuits that provide the functional elements for constructing the user's logic. The functionality of a CLB or an IOB can be customized during configuration by programming. For example, each CLB shown in FIG. 1 may perform any one of a variety of logic functions. The logic functions performed by a particular CLB and its interconnections are defined by data stored in associated configuration memory cells. A typical FPGA has tens of thousands of configuration memory cells.

User-configurable IOBs provide the interface between external package pins and the internal logic of the device. Each IOB controls one package pin and is used to control pad functions, such as signal direction, logic threshold, and slew rate. Since there are input, output, and bi-directional signals to deal with, IOBs are designed to be configurable to handle such signals.

In the majority of FPGA architectures, IOBs are connected to the nearest available pad, which seats a metal (usually gold) wire. (The metal wire is used to electrically connect the pad to a lead or a pin which provides the connection to the outside world.) This connectivity provides a uniformity of signal delays between pads and IOBs. However, some FPGA architectures require a "scrambling" of connections between pads and IOBs in order to satisfy the conflicting pin availability constraints of different package types. For example, routing may require IOBs to connect to remote pads due to pin constraints or a special need to connect an IOB to a certain pin such as a power pin or a control signal pin. This connectivity, illustrated in FIG. 2, may result in great disparity of signal path lengths and a corresponding spread of signal delays.

Figure 2:
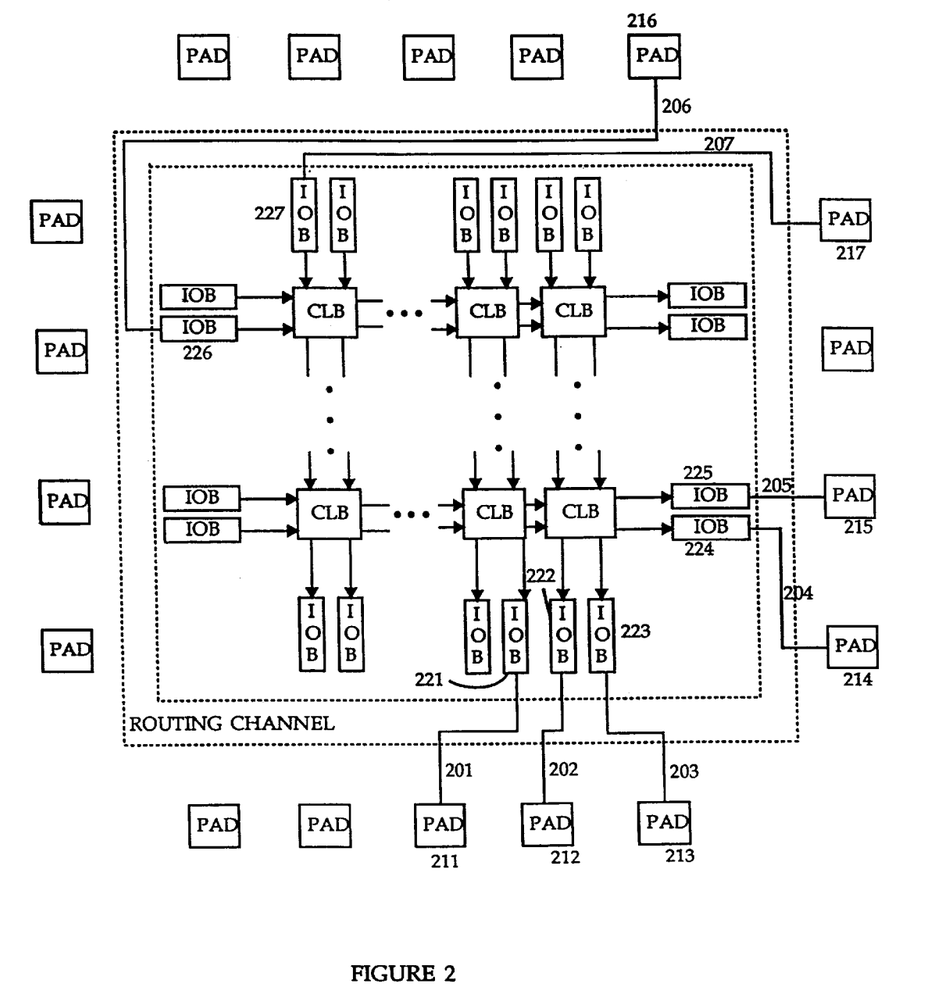
FIG. 2 shows PAD-IOB routing connections in an FPGA.

Referring to FIG. 2, lines 201–205 connect IOBs with the nearest available pad, thus providing the shortest signal delay. For example, line 201 connects IOB 221 to the nearest pad 211; line 202 connects IOB 222 to the nearest pad 212; line 203 connects IOB 223 to the nearest pad 213; line 204 connects IOB 224 to the nearest pad 214; and line 205 connects IOB 225 to the nearest pad 215. Lines 206 and 207, however, connect IOBs 226 and 227 with remote pads 216 and 217, respectively, thereby introducing longer delays in signal propagation along these routes. Consequently, there are significantly different delays for paths 201 and 206. Other factors that make the delays unpredictable include, for example, process and batch-to-batch variations. In some cases, to compensate for these disparate delays, a user may have to provide customized timing circuitry to handle different timing delays for each PAD/IOB pair.

Thus, it is not only desirable but necessary to equalize these delays, in order that set-up and hold time specifications for a particular device are met without having to provide extra circuitry. Set-up time refers to the time interval during which a signal must be stable at an input terminal prior to an active transition occurring at another input terminal. Hold time refers to the time interval during which a signal must be stable at an input terminal following an active transition occurring at another input terminal. If either a set-up or hold time specification is violated, I/O operations of an FPGA may not complete successfully.

In the past, delay equalization procedures for FPGAs have included: completion of chip artwork such as the floorplan for IOBs and CLBs, extraction of parasitic resistance and capacitance from the layout, and modeling of the interconnect based on these parasitics. These prior art methods further include simulation of path delays using the interconnect models, classification of different delays into "bins" having predefined delay ranges, and modification of chip artwork to incorporate equalization elements.

Unfortunately, these methods are time consuming and have several sources of potential errors and inaccuracies. For example, extraction of parasitic resistances and capacitances is very much dependent on accurate fabrication process characterization. Modeling of interconnects is often imprecise and worsens at sub-micron geometries. The "binning" process, which is necessary to reduce the number of different delay elements required, results in a further loss of precision.

Finally, the exact physical implementations of the delay elements are unlikely to perform as intended due to circuit layout constraints. For example, H. B. Bakoglu, in his treatise on phase-locked loop technique entitled "Circuits, Interconnections, and Packaging for VLSI," chapter 8, section 6, Addison-Wesley, 1990, discusses difficulties in eliminating clock skew problems due to on-chip RC delays and geometry.

Additional factors to consider are the effects of fabrication process variations. The resulting fabricated devices are likely to require at least one more design iteration before the delays are correctly implemented. If there are other members in a product family, the aforementioned process must be repeated for each family member. Over the life-span of a product, the whole situation may be further complicated by fabrication process enhancements, and shifts of production to different foundries, which render existing delay equalizations obsolete.

In a typical application, output slew rate control is also necessary in addition to input delay control. Typically, an integrated circuit chip is coupled to multiple MOS chips on a PCB (Printed Circuit Board), and high-current output stages are required to drive multiple chips. However, the long lines and distributed input capacitance and inductance in combination with fast output transition times may result in severe ringing. Suppose, for example, that an FPGA chip is configured as SRAM (Static Random Access Memory). In one read operation, the FPGA chip makes a high-to-low transition in all eight (8) data outputs (assuming an eight bit word length). The eight simultaneous transitions can draw a significant amount of transient current out of a power bus that is driving the eight IOBs. This draw of current can force the ground pin to rise momentarily above ground potential, along with any other outputs that are supposed to stay at the ground potential. This level of ground bounce can cause undesired transient behavior at the outputs or in the internal logic, possibly triggering a malfunction or logic errors. The problem is further exacerbated in systems with sixteen (16) or thirty two (32) bit word lengths.

In the past, various methods were used to minimize such power bus transients. In "Forming Damped LRC Parasitic Circuits in Simultaneously Switched CMOS Output Buffers," IEEE Custom Integrated Circuits Conference, pp 277–280, May, 1996, T. Gabara et al. discuss several techniques for reducing the ground bounce generation.

However, the prior art methods were subject to potential errors and inaccuracies due to their dependency on the device fabrication process. Furthermore, the prior art methods did not allow efficient post-fabrication configuration of the slew rate.

Accordingly, it would be advantageous to provide a means that allows efficient and reliable programming of delay and slew rate for a variety of signal paths without requiring redesign and refabrication of the circuit.

SUMMARY OF THE INVENTION

In a preferred embodiment of the invention, an integrated circuit incorporates a system for post-fabrication equalization of signal delays within the integrated circuit and comprises a programmable delay circuit for adjusting the propagation delays of signals inputted to the integrated circuit, and means for programming the delay circuit after fabrication of the integrated circuit to alter a delay value of the programmable delay circuit. The programmable delay circuit includes an electronically controllable means for altering the propagation delay of electronic signals. The programmable delay circuit includes a signal path, a delay circuit having a plurality of delay values, a switching circuit connected to the signal path and the delay circuit for switching a selected delay value into the signal path, and a memory programmable after fabrication of the integrated circuit for storage of data which controls the switching circuit and hence the delay value switched into the signal path. A preferred embodiment includes a logic circuit, a plurality of the programmable delay circuits connected to delay signals input to the logic circuit and wherein the delay circuits are programmed with delay times which together cause all of the input signal delays to the logic circuit to be equal.

A method for post-fabrication equalization of input signal delays within an integrated circuit according to the invention comprises the steps of (a) programming a memory in the integrated circuit with a code representative of desired delay times, (b) using the code stored in the memory to control a switch within the integrated circuit to switch into a signal path within the integrated circuit a selected one or more delay elements for equalizing the propagation delays of signals passing into the integrated circuit. Further included, in some embodiments, are the steps of measuring a current value of the propagation delay for a given load, determining whether or not the measured current value of the delay is a desired delay, and reprogramming the memory with a new code to alter the value of the delay if the measured delay is not the desired delay and repeating these steps of delay measurement and delay adjustment until the value of the delay is correct. In the preferred embodiment, steps (a) and (b) are performed for a plurality of memories, switches and delay elements to generate a plurality of delay times for different signals input to a logic circuit of the integrated circuit so that together all signals input to the logic circuit encounter the same delay time.

In a specific application of the invention, a field programmable gate array (FPGA) of the type which includes a plurality of external connection pads, a plurality of configurable logic blocks (CLBs), a plurality of input/output blocks (IOBs) connected to each CLB, and a separate connective lead connecting each IOB to a separate pad, includes the improvement of a programmable delay circuit in each IOB which comprises a signal path through the IOB connected to a corresponding one of the connective leads, a delay circuit having a plurality of delay values, a switching circuit connected to the signal path and the delay circuit for switching a selected delay value into the signal path as it enters the IOB, and a memory programmable after fabrication of the FPGA for storage of data which controls the switching circuit and hence the delay value switched into the signal path. The connective leads are of different lengths and have different delay values and further wherein for all the IOBs connected to a given CLB, each programmable delay circuit is programmed to have a delay value which, when added to the delay value of the connective lead connected to the IOB containing the programmable delay circuit, is a single predetermined number. In one preferred embodiment, the delay circuit includes a plurality of delay elements, each having a delay value which is a different power of two multiple of a first delay value. The delay circuit can comprise a plurality of capacitive loads selected to be different multiples of the power of two of an initial capacitive load.

In one FPGA, the programmable memory cells are loaded with appropriate data during a device configuration stage. Delay equalization can be achieved for unequal routing delays between IOBs and PADs by programming the memory cells such that the differences are compensated and the delays seen by device I/O pins are equal. In one embodiment, the memory cells are implemented by SRAMs and the switches by CMOS transmission gates.

The invention also provides a slew rate control circuit for an inverter or a buffer to provide an optimal slew rate. The slew rate control circuit comprises a plurality of memory cells coupled to a current mirror via a plurality of switches. The current mirror is coupled to a plurality of current sources via the plurality of switches. Appropriate data are programmed or loaded into the memory cells to selectively turn the switches on or off. The amount of current flowing through the current mirror is controlled by the switches selectively being turned on. The current mirror is also coupled to the inverter or buffer to control its supply current. The slew rate of the inverter or buffer is thus controlled via the memory cell programming.

DETAILED DESCRIPTION OF THE INVENTION

Figure 3:
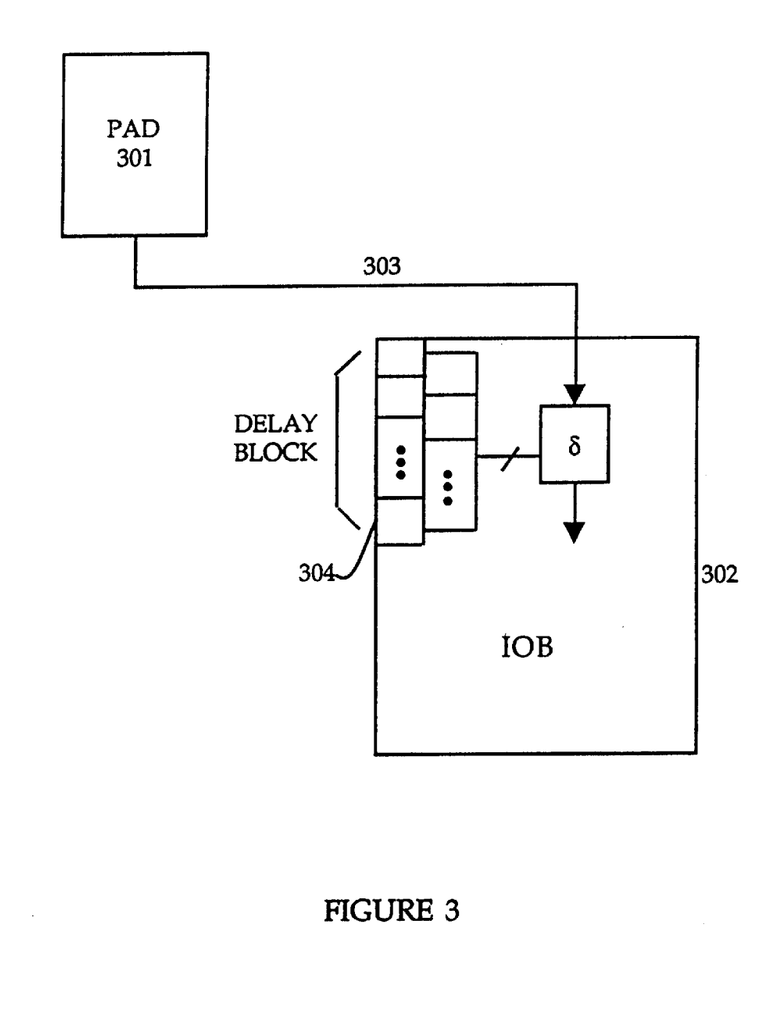
FIG. 3 shows one embodiment of a programmable delay element constructed in accordance with the invention.

FIG. 3 shows one embodiment of a programmable delay element constructed in accordance with the invention. The programmable delay element in FIG. 3 is designed to provide a mechanism that allows delays to be assigned after the system that contains the delay element has been fabricated. As shown in the Figure, IOB 302 is provided with a delay block disposed along signal path 303, thereby providing a delay δ to a signal propagating along signal path 303. The amount of delay is programmable via configuration or programming of memory cells 304 such that the delay assigned to a data path can be varied depending upon the particular application. In one embodiment, memory cells 304 are implemented using SRAMs.

Figure 4:
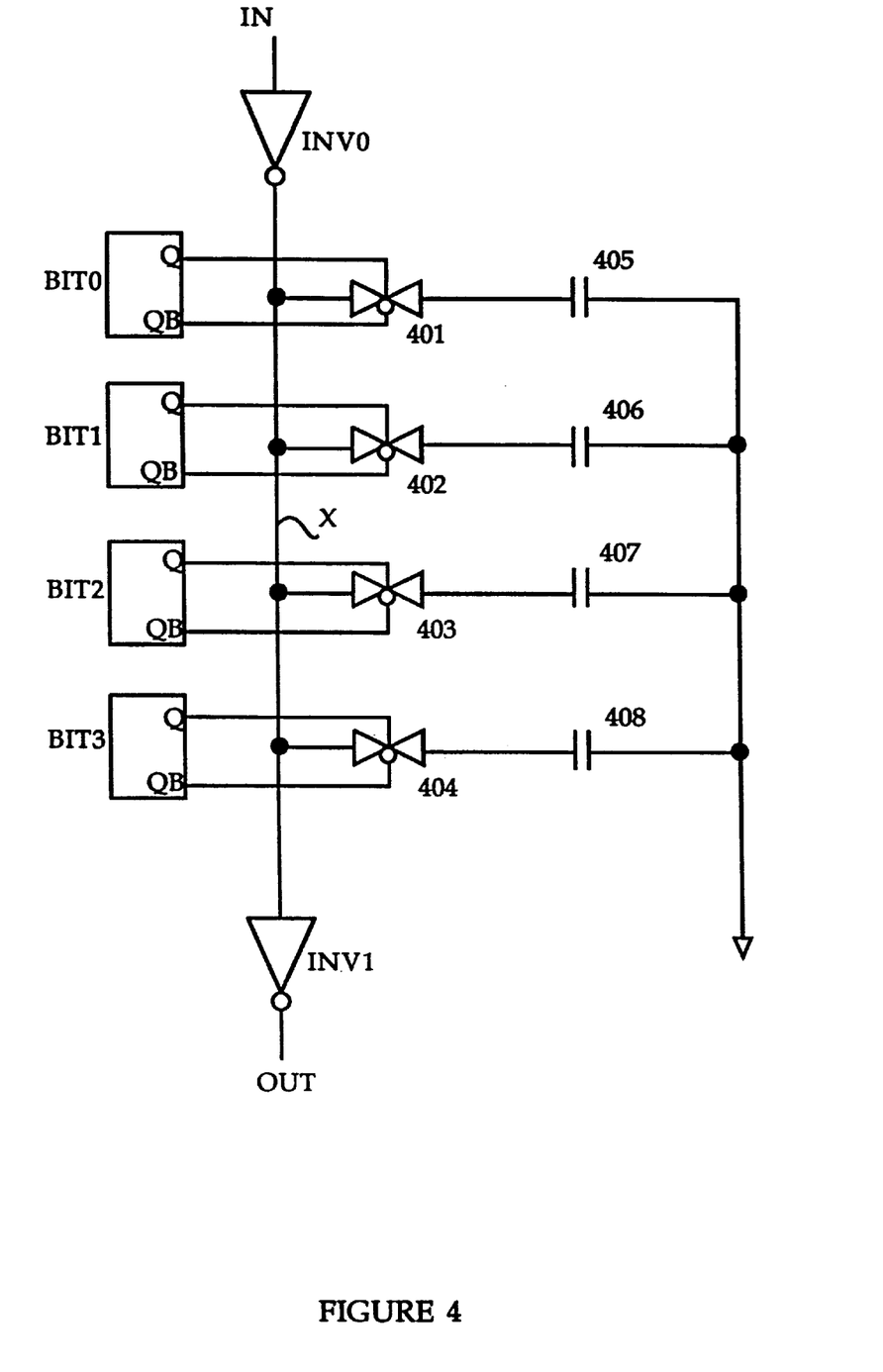
FIG. 4 is a block diagram of the programmable delay element of FIG. 3 shown in greater detail.

FIG. 4 is a detailed block diagram of the programmable delay element of FIG. 3. The amount of the delay is controlled by memory cells BIT0–BIT3 resident within the delay block. Upon configuration of the device, the bit pattern which represents the required delay for each IOB is loaded into the memory cells BIT0, BIT1, BIT2, and BIT3. In one embodiment, the user is allowed access to this information. In another embodiment, the delay programming information is not accessible to the user. After device configuration, memory cells BIT0, BIT1, BIT2, and BIT3 are inaccessible to the user in normal operating mode.

Typically, memory cells BIT0–BIT3 are implemented using SRAMs, but other implementations are possible including EPROM (UV erasable programmable read-only memory), EEPROM (Electrically Erasable Programmable ROM), and Flash memories. The number of memory cells can be varied for different embodiments of the invention, but is typically some power of two for efficiency in implementation.

In FIG. 4, a weak inverter INV0 drives internal node X. Capacitors 405–408 are connected to node X via transmission gates 401, 402, 403, and 404, respectively. Capacitors 405408 have capacitance values of C0, C1, C2, and C3, respectively. Note that although four capacitors are provided in this embodiment, the actual implementation of the delay element can be varied in different embodiments of the invention without departing from the scope of the invention.

Transmission gates 401, 402, 403, and 404 are controlled by memory cells BIT0, BIT1, BIT2, and BIT3, respectively. The Q output terminals of memory cells BIT0, BIT1, BIT2, and BIT3 are coupled to the gates of NMOS transistors (not shown for simplicity) of transmission gates 401, 402, 403, and 404, respectively. The QB output terminals of memory cells BIT0, BIT1, BIT2, and BIT3 are coupled to the gates of PMOS transistors (also not shown for simplicity) of transmission gates 401, 402, 403, and 404, respectively.

A transmission gate is "on" if there is a logic one (1) stored in the corresponding memory cell. Thus, a bit pattern of "1010" stored in memory cells BIT0, BIT1, BIT2, and BIT3, respectively, turns on transmission gates 401 and 403, while turning off transmission gates 402 and 404. In this particular embodiment, transmission gates 401, 402, 403, and 404 are implemented using a CMOS architecture.

The capacitors themselves may all be of equal value, or they may have different values. In this particular embodiment, there are "power of two" multiples of the smallest value C0, i.e., C1 is set to 2×C0, C2 to 4×C0, and C3 to 8×C0. The capacitors can be assigned values other than listed above to provide fine tuning of delay depending on the requirements of a specific application.

Referring to FIG. 4, by altering the bit pattern in the memory cells, the load seen by inverter INV0 on node X is varied. Changes in this load result in variations in the propagation delay from input IN, through inverters INV0 and INV1, to output OUT. For example, if memory cells BIT0:BIT1:BIT2:BIT3 are programmed to "1111", respectively, transmission gates 401–404 are turned on and the load added to node X is at the largest value of C0+C1+C2+C3 for the incoming signal. On the other hand, if memory cells BIT0: BIT1: BIT2: BIT3 are programmed to "0000", respectively, all of transmission gates 401–404 are turned off, and the added load is zero for an incoming signal. The incoming signal thus sees only the parasitic load at node X for the minimum delay value. By programming appropriate bit patterns in memory cells BIT0, BIT1, BIT2, and BIT3, a desired signal propagation delay is obtained.

By using binary weighted capacitor values as described above, a wide range of delays can be accommodated by a relatively small number of memory cells. If desired, the exact delay value required for each IOB can be obtained by measuring a propagation delay for a given load during device characterization. If the invention is used in an FPGA device, then the required delay value can be encoded as part of the bit stream used to configure the FPGA. If desired, programming software for the programmable delay element can maintain a database of different delay values for different speed grades, family members, and different foundries, thereby providing quick automatic references for future applications without repeating the delay measurement process to find a delay value for each new application.

Figure 5:
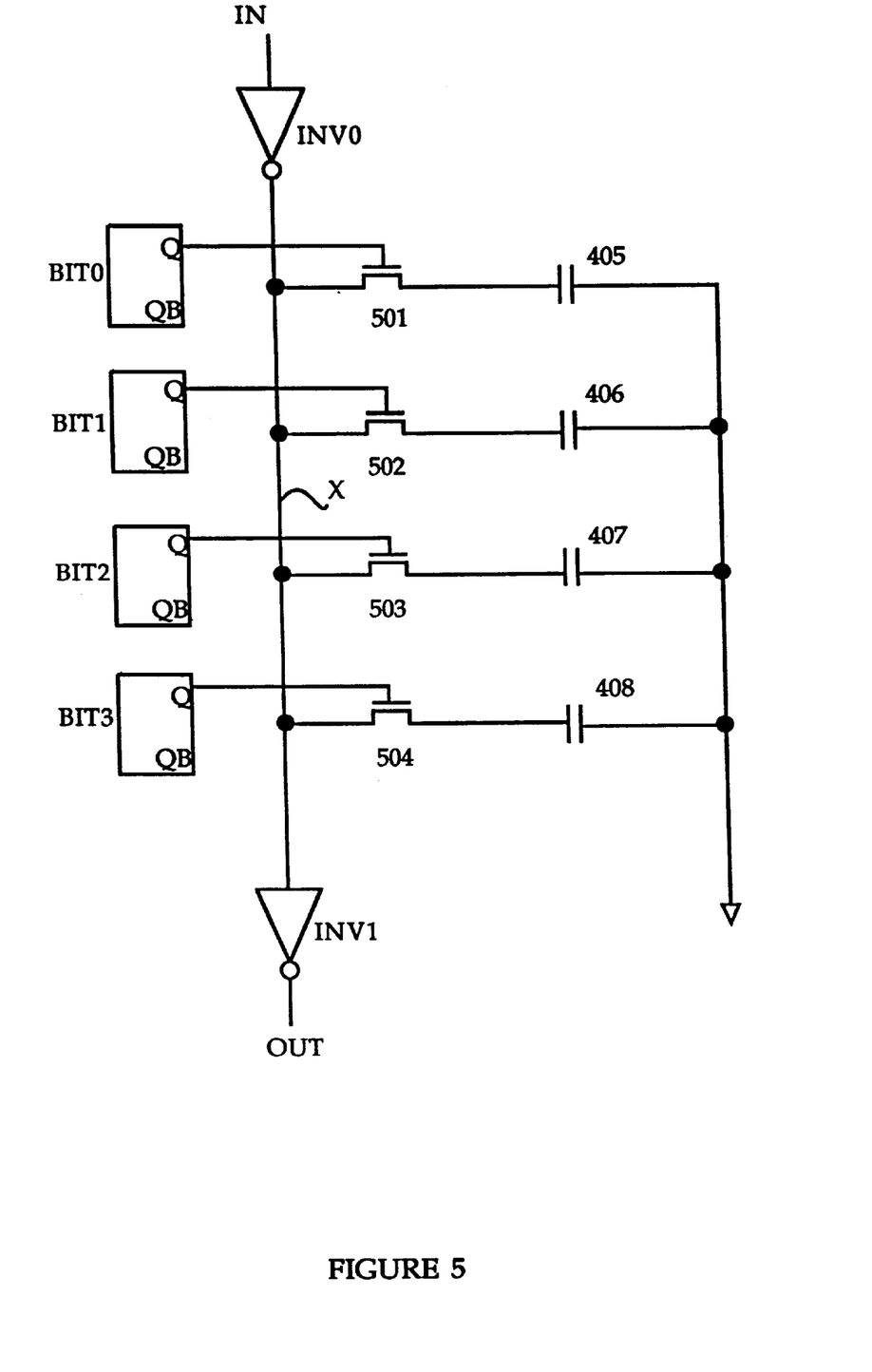
FIG. 5 is an alternate embodiment of a programmable delay in accordance with the invention.

FIG. 5 is an alternate embodiment of the programmable delay in accordance with the invention. Instead of CMOS transmission gates, the embodiment of FIG. 5 uses NMOS pass transistors 501–504. Four capacitors, 405–408, are connected to node X via pass transistors 501, 502, 503, and 504, respectively. Pass transistors 501, 502, 503, and 504 are controlled by memory cells BIT0, BIT1, BIT2, and BIT3, respectively. The Q output terminals of memory cells BIT0, BIT1, BIT2, and BIT3 are coupled to the gates of NMOS transistors 501, 502, 503, and 504, respectively.

This particular embodiment implements a programmable delay element similar to that of FIG. 4, but requires fewer transistors. In another embodiment of the invention, it would be also appreciated by one skilled in the art that PMOS transistors or other suitable switchable devices can be used in place of NMOS transistors as pass transistors within the scope of the invention.

The programmable delay elements shown in FIGS. 4 and 5 allow post-fabrication adjustment and programming of input delay to iteratively alter input delays without circuit redesign and refabrication, thus minimizing debugging costs and reducing time-to-market.

Figure 6:
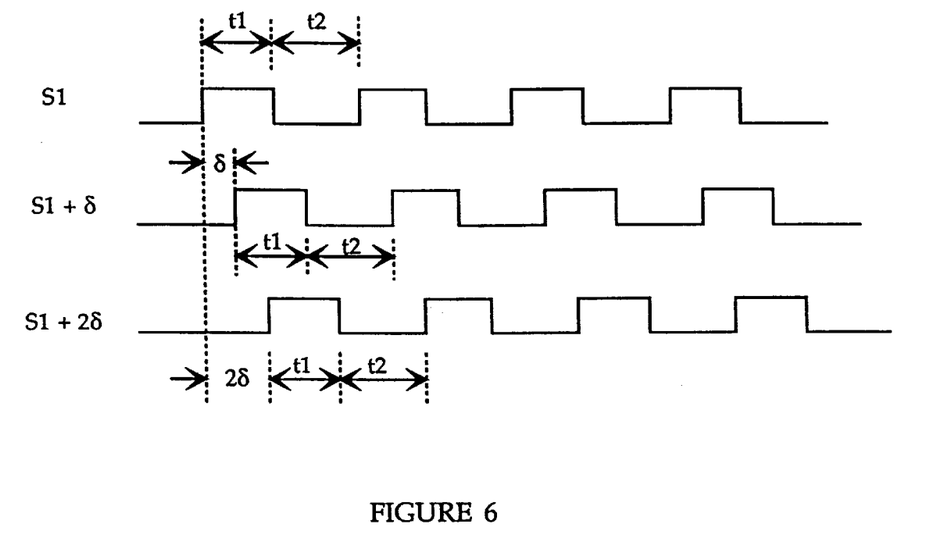
FIG. 6 shows timing diagrams of a signal and its delay waveforms in accordance with the invention.

When a delay element is used in a signal path as described above, the delayed signal retains its original waveform. FIG.

6 shows timing diagrams of a signal and its delay waveforms in accordance with the invention. In FIG. 6, signal S1 has a high period t1 and a low period t2. When a delay of δ is introduced, signal S1 is time-shifted to the right by time δ. The delayed signal S1+δ still maintains the relative positions of transition edges such that the high period t1 and the low period t2 is not altered by the delay. The delayed signal S1+2δ also maintains the relative positions of its original waveform.

Programmable methods can be applied to control the slew rate of an output buffer and minimize power bus transients, thereby increasing the time for the output to reach the switching threshold. The slew rate is a time-domain quantity and can be obtained by considering the following relationship:

$$i = C\frac{dV}{dt}$$

where C is the capacitance, i the current, V the voltage, and t the time. Then $$\text{Slew rate} = \frac{dV}{dt} = \frac{i}{c}$$

Thus, a low slew rate indicates a slower rate of change for the voltage with respect to time.

For a given capacitive load C with a driver coupled to it, the charging rate can be controlled via the current feeding the load. Thus, the charging rate can be controlled by the driver slew rate, and therefore by controlling supply current to the driver. For a given load, a driver slew rate is approximately linearly proportional to the supply current provided to the driver.

Figure 7:
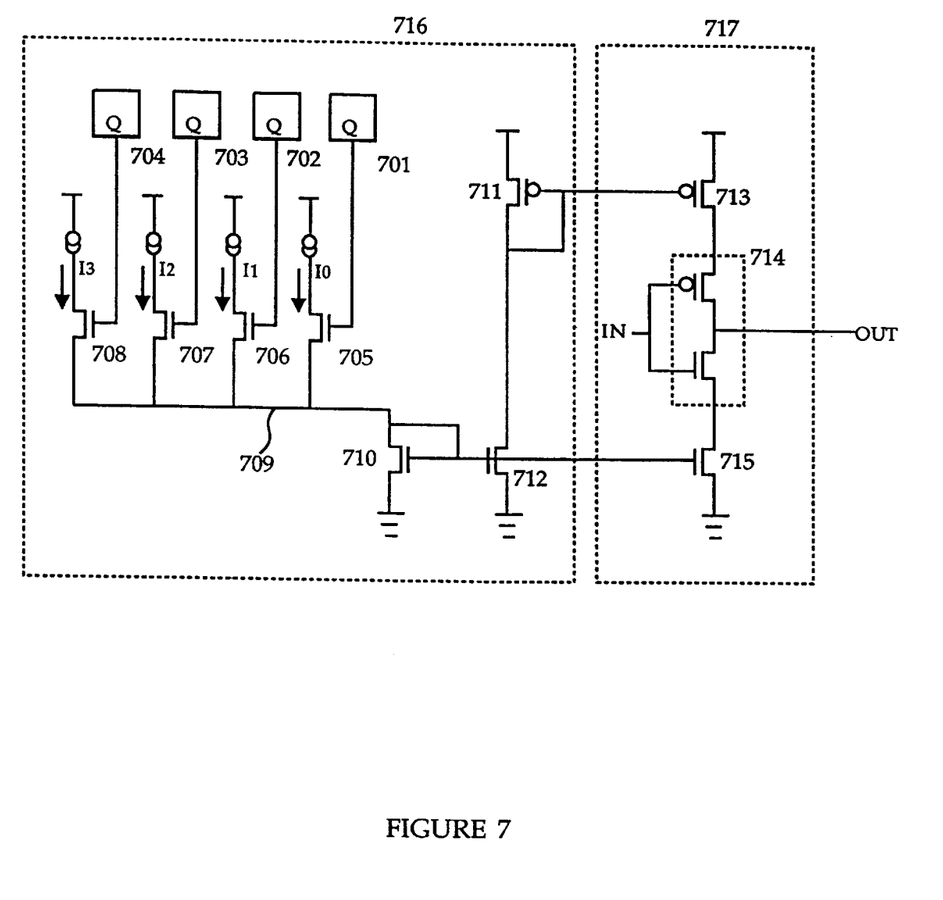
FIG. 7 illustrates a programmable slew-rate element constructed in accordance with the invention.

FIG. 7 illustrates a programmable slew-rate element constructed in accordance with the invention. The embodiment of FIG. 7 comprises memory cells 701–704 coupled to the gates of switch transistors 705–708, respectively, wherein switch transistors 705–708 are in turn coupled to current sources I0–I3, respectively. In one embodiment, transistors 705–708 have a size ratio of 1:2:4:8 such that transistor 708 is eight times bigger than transistor 705 in channel width/length ratio. The sizes of current sources I0–I3 are ratioed in a similar manner. Note that the size ratio can be varied in alternate embodiments depending on the requirements of a particular device.

By programming selected memory cells, transistors 705–708 are selectively turned on to allow a desired amount of current to flow through node 709. Transistor 710 has its gate coupled to its drain, and its source coupled to ground potential. The gate of transistor 710 is also commonly coupled to the gates of transistors 712 and 715 which proportionally mirror the amount of the current flowing through transistor 710. In this manner, transistor 712 is forced on to mirror and provide the current sinking through transistor 711. The gate of transistor 711 is also coupled to the gate of transistor 713.

Transistors 713, 715 and inverter 714 are connected in series between a supply voltage and the ground. Transistors 713 and 715 are used to mirror the current flowing through transistors 711 and 712 respectively, and therefore act as constant current supplies for inverter 714. Thus, the supply current to the inverter 714 is proportional to the current flowing through node 709, which is controlled by programming the states of memory cells 701–704. Accordingly, the supply current to the inverter 714 is controlled by memory cells 701–704.

Since the slew rate of inverter 714 has an approximately linear relationship with the supply current from transistors 713 and 715, and the supply current is proportional to the current through node 709, the slew rate of inverter 714 is programmable by loading memory cells 701–704 with appropriate data to select the desired drive current at node 709 via transistors 705–708.

Although the embodiment shown in FIG. 7 uses NMOS transistors 705–708 to allow current flow to node 709, PMOS transistors, CMOS transmission gates, or other suitable switching devices can also be used to implement switches in place of the NMOS transistors 705–708. It will be appreciated by one skilled in the art that one "master" element 716 can be used to control the slew rates of the several "slave" elements 717, by extending the current mirroring exemplified by transistors 713 and 715.

It will also be appreciated by one skilled in the art that the slew rate control circuit of the invention can be used to control supply current in any preceding or following stages in a signal path comprising a number of inverters or buffers to introduce further delay in the path.

Figure 8:
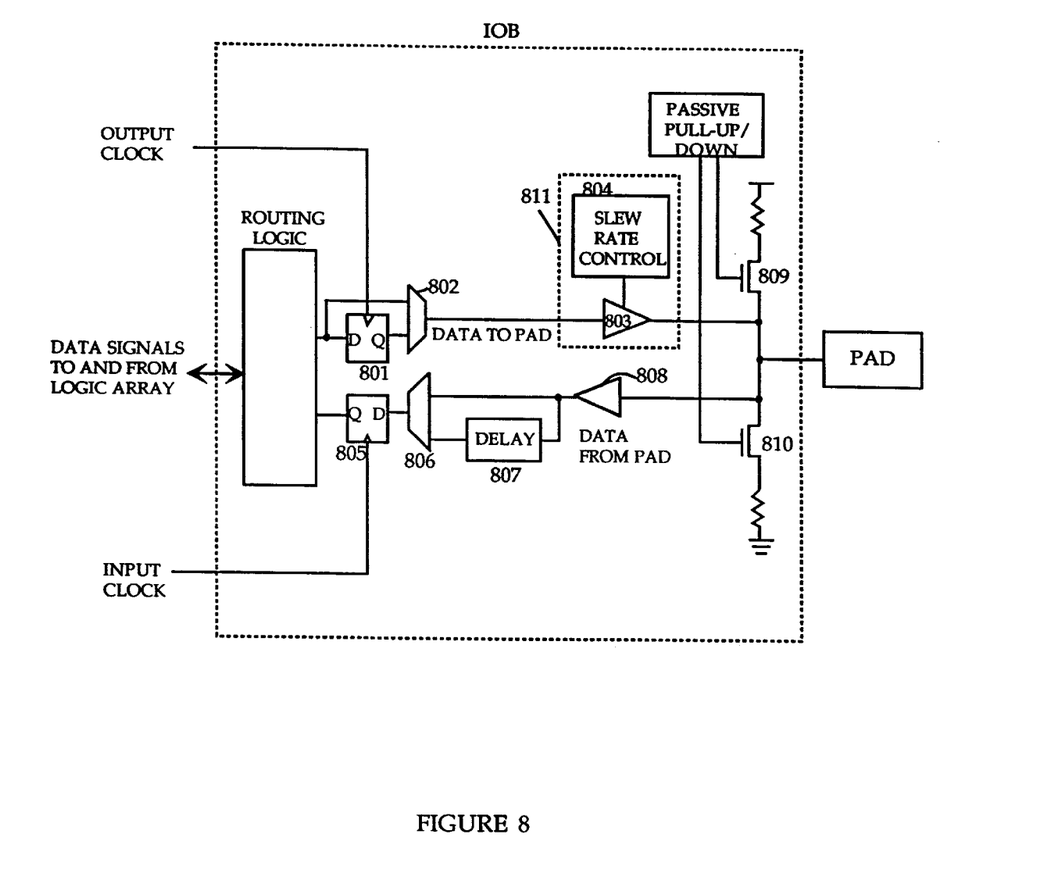
FIG. 8 shows a block diagram of an IOB that incorporates a programmable delay element and slew rate control logic.

FIG. 8 shows a block diagram of an IOB that uses a programmable delay element and slew rate control logic. This particular application represents only one example of many possible applications of the invention, and therefore should not limit the scope of the invention. The programmable delay and slew rate control logic may similarly be implemented in other digital circuit applications, either separately or in combination.

Referring to FIG. 8, the data input from the pad can be optionally delayed via delay 807. With the delayed signal selected via multiplexer 806, the setup time of input flip-flop 805 is increased so that normal clock routing does not result in a positive hold-time requirement, which can lead to unreliable operation.

In practice, input flip-flop 805 typically has a positive hold time requirement between its D and clock inputs. However, for reliable system operation, there should be no positive hold time apparent at the I/O pins. These conflicting constraints can be resolved, provided that the data delay is greater than or equal to the sum of the clock delay and the register hold time. If the data delay is equal to the sum of the clock delay and register hold time, then a minimum set-up time at the I/O pins results.

In cases where data delay is less than the sum of clock delay and register hold time, the register hold time will be violated (assuming zero hold time at the I/O pins). Insertion of programmable delay element 807 obviates this problem. Delay element 807 uses a programmable delay such as the circuit shown in FIG. 4 or the circuit shown in FIG. 5. Sufficient delay removes the possibility of a positive data hold-time requirement at the external pin, while allowing the register hold time criterion to be met.

A slew rate control circuit, such as that of FIG. 7, is used to implement programmable slew rate buffer 811. Programmable slew rate buffer 811 comprises slew rate control circuit 804 and output buffer 803. Output buffer 803 corresponds to inverter 714 of FIG. 7. Slew rate control circuit 804 programs the slew rate of output buffer 803, which is typically reduced to minimize power bus transients as described above. For signals that require a fast slew rate, the slew rate of output buffer 803 is adjusted accordingly by programming associated memory cells in slew rate control circuit 804 as described above.

Passive pull-up/down logic controls pull-up/down transistors 809 and 810 for tying unused pins to VCC or ground to minimize power consumption and reduce noise sensitivity.

Thus, a method and apparatus for implementing a programmable delay element and a programmable slew rate element have been described. It is understood that particular embodiments described herein are illustrative only and should not limit the present invention thereby. The invention is defined by the claims and their full scope of equivalents.

What is claimed is:

1. A slew rate control circuit for controlling a logic element, said circuit comprising:

at least one switch coupled to a current source;

at least one memory cell coupled to said at least one switch;

a first current mirror coupled to said at least one switch; and a second current mirror coupled to said first current mirror, wherein said logic element is coupled to said first and second current mirrors.

2. The circuit of claim 1 wherein said at least one switch includes a CMOS transmission gate.

3. The circuit of claim 1 wherein said at least one switch includes an NMOS pass transistor.

4. The circuit of claim 1 wherein said at least one switch includes a PMOS pass transistor.

5. The circuit of claim 1 wherein said at least one switch includes an NPN transistor.

6. The circuit of claim 1 wherein said at least one switch includes a PNP transistor.

7. The circuit of claim 1 wherein said memory cell includes a static RAM.

8. The circuit of claim 1 wherein said memory cell includes an EEPROM.

9. The circuit of claim 1 wherein said memory cell includes a Flash memory.

10. The circuit of claim 1 wherein said memory cell includes an EPROM.

11. The circuit of claim 1 wherein said memory cell includes a flip-flop.

12. The circuit of claim 1 wherein said memory cell includes a fuse.

13. The circuit of claim 1 wherein said memory cell is non-volatile.

14. The circuit of claim 1 wherein said first current mirror comprises:

a first NMOS transistor having a gate and a drain coupled to said at least one switch;

a second NMOS transistor; and a third NMOS transistor coupled to said logic element, said gate of said first NMOS transistor being coupled to a gate of said second NMOS transistor and a gate of said third NMOS transistor.

15. The circuit of claim 14 wherein said second current mirror comprises:

a first PMOS transistor having a gate and a drain coupled to said drain of said second NMOS transistor; and a second PMOS transistor coupled to said logic element, a gate of said second PMOS transistor being coupled to said gate of said first PMOS transistor.

16. The circuit of claim 1 wherein said first current mirror comprises:

a first NPN transistor having a base and a collector coupled to said at least one switch;

a second NPN transistor; and a third NPN transistor coupled to said logic element, said base of said first NPN transistor being coupled to a base of said second NPN transistor and a base of said third NPN transistor.

17. The circuit of claim 16 wherein said second current mirror comprises:

a first PNP transistor having a base and a collector coupled to said collector of said second NPN transistor; and a second PNP transistor coupled to said logic element, a base of said second PNP transistor being coupled to said base of said first PNP transistor.

18. The circuit of claim 1 wherein said at least one switch includes a plurality of switches and said current source includes a plurality of current sources.

19. The circuit of claim 18 wherein each switch is sized relative to another switch and wherein each current source is sized relative to another current source.

20. The circuit of claim 18 wherein said plurality of switches have a predetermined size ratio and wherein said plurality of current sources have said predetermined size ratio.

21. The circuit of claim 1 wherein the logic element is an inverter.

22. The circuit of claim 1 wherein the logic element is a buffer.

23. The circuit of claim 1 further including a plurality of logic elements in a signal path, at least one of said plurality of logic elements being controlled by said slew rate control circuit.

24. The circuit of claim 23 wherein each of said plurality of logic elements is controlled by a corresponding slew rate control circuit.

* * * * *